United States Patent
Chen et al.

(10) Patent No.: US 10,352,968 B2
(45) Date of Patent: Jul. 16, 2019

(54) CURRENT SHUNT

(71) Applicant: Ford Global Technologies, LLC, Dearborn, MI (US)

(72) Inventors: Chingchi Chen, Ann Arbor, MI (US); Xi Lu, Northville, MI (US); Guangyin Lei, Dearborn Heights, MI (US); Zhuxian Xu, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 346 days.

(21) Appl. No.: 15/471,214

(22) Filed: Mar. 28, 2017

(65) Prior Publication Data

US 2018/0284158 A1 Oct. 4, 2018

(51) Int. Cl.
*G01R 15/14* (2006.01)

(52) U.S. Cl.
CPC .................... *G01R 15/146* (2013.01)

(58) Field of Classification Search
CPC ... G01R 1/203; G01R 15/146; G01R 19/0007
See application file for complete search history.

(56) References Cited

U.S. PATENT DOCUMENTS

| 5,446,372 | A  | * | 8/1995 | Berkcan | G01R 1/203 |
| | | | | | 324/117 R |
| 8,493,059 | B2 | | 7/2013 | Homma et al. | |
| 9,395,396 | B2 | * | 7/2016 | Kageyama | G01R 1/203 |
| 2016/0020004 | A1 | | 1/2016 | Kampl et al. | |
| 2016/0041206 | A1 | | 2/2016 | Hetzler | |
| 2016/0109484 | A1 | * | 4/2016 | Sato | G01R 1/203 |
| | | | | | 324/126 |

FOREIGN PATENT DOCUMENTS

DE 10128433 C1 10/2002

\* cited by examiner

*Primary Examiner* — Tung X Nguyen
(74) *Attorney, Agent, or Firm* — David Kelley; Brooks Kushman P.C.

(57) ABSTRACT

A shunt includes a power terminal having a planar first potential region (FPR) connected to a second potential region (SPR) through a resistive element, the SPR being offset from and parallel to the FPR. The shunt includes a sensor terminal having a first potential lead (FPL) connected to the FPR, and a second potential lead (SPL) connected to the SPR and separated from the FPL by an insulation sheet. The SPL and sheet cover the resistive element.

19 Claims, 2 Drawing Sheets

CURRENT SHUNT

TECHNICAL FIELD

The present disclosure relates to current shunts.

BACKGROUND

Precise current measurements are required for quality assurance and product validation. Because current cannot be measured nonintrusively, resistive shunts are placed in current flow paths to indirectly measure current flow. Self-inductances associated with the shunt can narrow measurement bandwidths and cause measurement errors.

SUMMARY

A shunt includes a power terminal having a planar first potential region (FPR) connected to a second potential region (SPR) through a resistive element, the SPR being offset from and parallel to the FPR. The shunt includes a sensor terminal having a first potential lead (FPL) connected to the FPR, and a second potential lead (SPL) connected to the SPR and separated from the FPL by an insulation sheet. The SPL and sheet cover the resistive element.

A shunt includes a power terminal having a substantially planar first potential region (FPR) connected to a second potential region (SPR), that is substantially parallel to the FPR, through a resistive element having a predetermined resistance. The shunt includes a sensor terminal including a first potential lead (FPL) connected to the FPR at a plurality of solder joints. The FPL has a pointed shape defining current paths such that the current paths through the sensor terminal have similar lengths. The similar lengths reduce resistive variance among the current paths and include a second potential lead (SPL) connected to the SPR and separated from the FPL by an insulation sheet. The SPL and sheet cover the resistive element.

A shunt includes a power terminal having substantially planar first potential region (FPR) connected to a second potential region (SPR), that is substantially parallel to the FPR, through a resistive element having a predetermined resistance and having a nonlinear arrangement along a plane of the FPR such that current paths through the resistive element are same. The shunt includes a sensor terminal having a first potential lead (FPL) connected to the FPR, and a second potential lead (SPL) connected to the SPR. The SPL is separated from the FPL by an insulation layer.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Indirect measurement of circuit current may be obtained with a voltage drop reading and Ohms law. The voltage drop may be measured across a resistor. The resistor may have an precise, predefined, and insignificant resistance. The resistance may be minimized such that negligible current losses or disruptions occur. The voltage drop across the resistor may be measured to determine the current flow through the circuit using Ohms law. Indirect measurement of circuit current introduces measurement errors due to the minimal size of the resistor and self-inductances or noise associated with the resistor. A current shunt may have a substantially planar structure to improve the bandwidth of the shunt. The planar shunt may have a mutual-inductance (current from power terminal and voltage from signal terminal) between 0.1-5.0 nH, and the planar shunt may have a self-inductance (power terminal loop) of 0.5-10.0 nH, which is similar to other nonplanar shunts. The planar shunt may have a bandwidth of 50-200 MHz, which is wider than nonplanar shunts that typically have a bandwidth of about 7.2 MHz.

Figure 1:
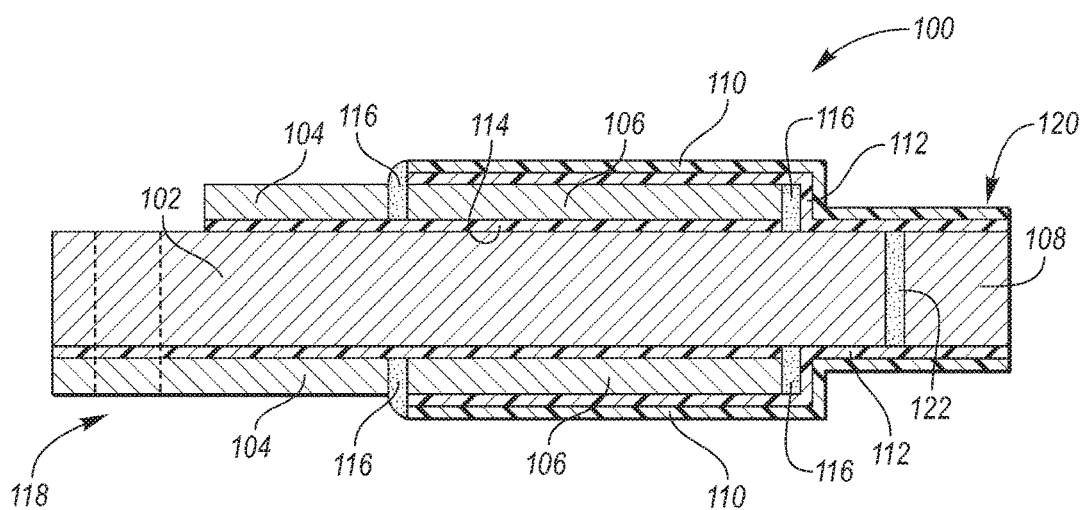
FIG. 1 is a side view of a linear, planar current shunt.

Referring to FIG. 1, a side view of a linear, planar current shunt 100 is shown. The shunt includes a power terminal 118 on one end. The power terminal 118 end may conduct electricity from a relatively high current source. For example, a power module of an inverter that include IGBTs may be connected to the power terminal 118. The shunt may be power-side or ground-side connected. Current from the source is fed through the first potential region (FPR) 102 of the power terminal 118. Current flows through the resistive elements 106 to the second potential region (SPR) 104. The FPR 102 may have a different electric potential than the SPR 104 due to the voltage drop across the resistive elements 106. The FPR 102 and SPR 104 are separated by insulation 114. The current may flow in either direction, creating a voltage drop across the resistor.

The FPR 102 and SPR 104 may have a planar configuration, and the FPR 102 and SPR 104 are conductors. Any type of conductive material may be used (e.g., copper, silver, gold). Conductor refers to any conductive material typically used to conduct electricity. For example, copper has a resistivity of $1.68 \times 10^{-8}$. Any material having a resistivity less than one may be considered a conductor for the purposes of this application. The insulation 114 may be any type of insulating or dielectric material (e.g., epoxy). Any material having a resistivity greater than 1. Although shown as two layers, on the top and bottom of the FPR 102, the SPR 104 may be a singular piece wrapped around the FPR 102. Meaning FIG. 1 may be a cross-sectional view of the shunt 100.

The SPR 104 may be offset from the FPR 102 such that the SPR 104 is above and below the FPR 102. The SPR 104 and FPR 102 may be parallel. The resistive elements 106 may be any type of resistive material (e.g., lead, carbon, film). Any material having a resistivity greater than 1. Any number of resistive elements 106 may be used. The resistive elements 106 may be soldered to the FPR 102 and SPR 104 through solder joints 116. Any type of solder may be used (e.g., lead, zinc, tin). Other interconnect technology can be used to connect the FPR 102, SPR 104, and resistive elements 106 (e.g., conductive epoxy, sintered metal joint, diffusion bonding). The resistive elements 106 may be planar and lie along the same plane as the SPR 104.

The current shunt 100 may also include a signal terminal 120 on one end to measure the voltage drop across the resistor. The signal terminal may include, house, or establish a first potential lead (FPL) 108 and a second potential lead (SPL) 110. The FPL 108 may be electrically connected to the FPR 102 such that a voltage drop across the resistive elements 106 can be measured by a voltmeter or oscilloscope. For example, the FPL 108 may be soldered to the FPR 102. The SPL 110 may be insulated from FPL 108 with an insulation sheet 112. The insulation sheet 112 and SPL 110 are wrapped around or covering at least a portion of the resistive elements 106. The insulation sheet may further shield noise and limit self-inductance of the sensitive voltage measurement. The insulation sheet 112 may prevent shorts between the SPL and the resistive elements 106. The SPL 110 may be connected to the SPR 104 to properly ground the sensing measurement performed by the SPL 110 and FPL 108. In some embodiments, the FPL 108 and SPL 110 may be part of an oscilloscope probe (not shown). The FPL 108 and SPL 110 may connect to the oscilloscope for measuring the voltage drop across the resistive element 106.

Figure 2:
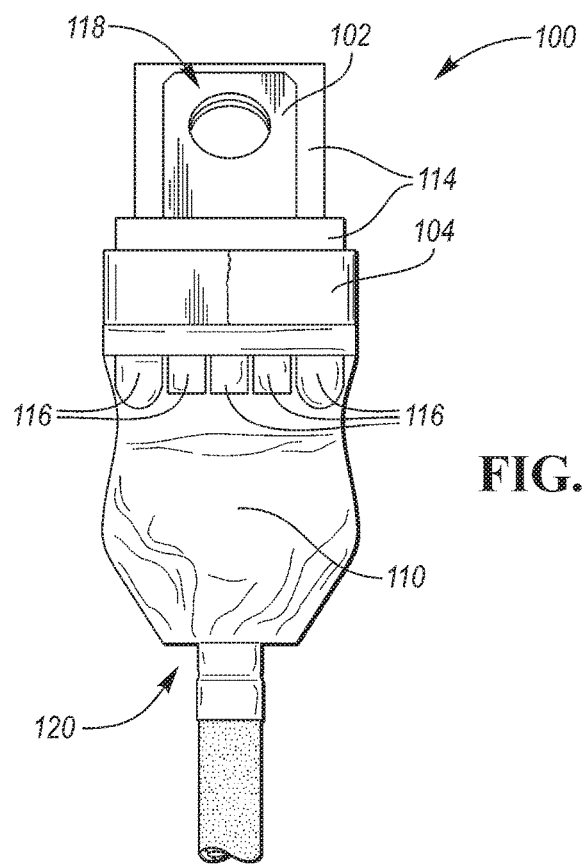
FIG. 2 is a top view of a linear, planar current shunt.

Referring to FIG. 2, a top view of the shunt 100 is shown. The shunt has a power terminal 118. FPR 102 conducts electric current from the power terminal 118. The FPR 102 is connected to resistive elements 106 (not shown). The resistive elements 106 are connect to a SPR 104 through solder joints 116. An insulator 114 separates the FPR 102 and SPR 104. A signal terminal 120 includes an SPL 110 that covers a portion of the resistive elements 106 and the shunt 100. The SPL 110 is soldered to the SPR 104 through solder joints 116, which may be the same or different from the solder joints 116 joining the SPR and the resistive elements 106.

Figure 3:
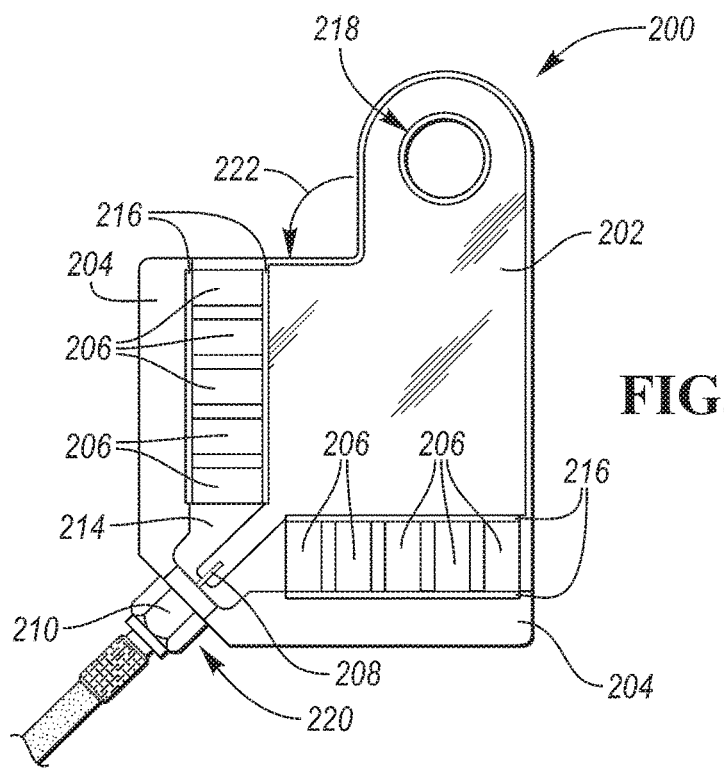
FIG. 3 is a top view of a 90° planar current shunt.
Figure 4:
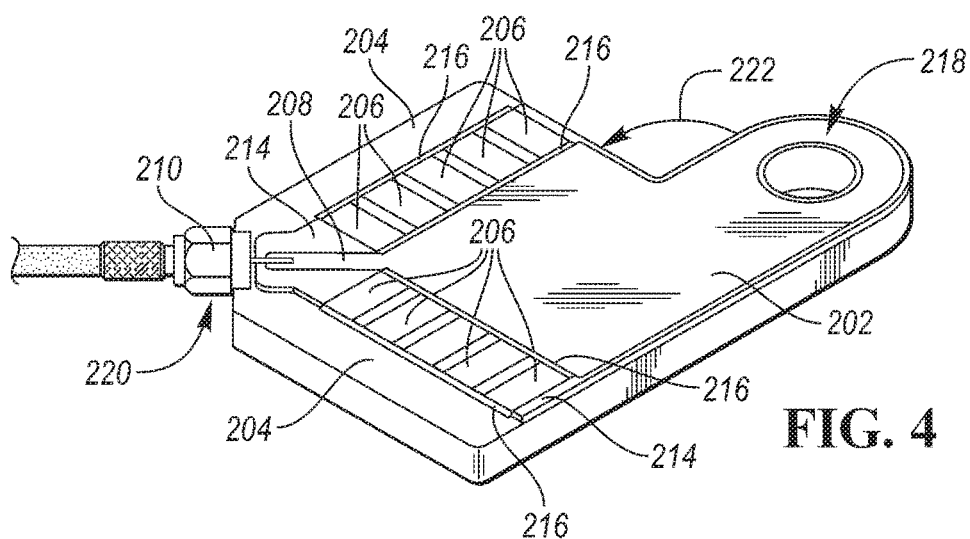
FIG. 4 is an isometric view of a 90° planar current shunt.
Figure 5:
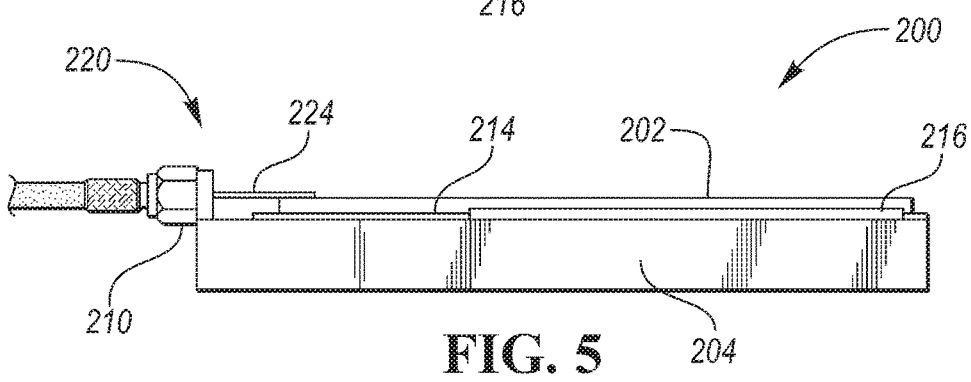
FIG. 5 is a side view of a 90° planar current shunt.

Referring to FIGS. 3-5, a top view of a shunt 200 is shown. The shunt 200 has a FPR 202 soldered to a plurality of resistive elements 206 with solder joints 216. The resistive elements 206 are further connected to the SPR 204 through solder joints 216. Both the FPR 202 and SPR 204 have a 90° corner 222 to ensure the terminal 218 is formed to connect with a power module of an inverter. The corner 222 may have different bending degrees to fit various power modules. For example, the corner 222 may be 135°. The resistive elements 206 are nonlinearly distributed between the FPR 202 and SPR 204. Meaning, the conductive paths through the FPR 202 and SPR 204 have similar lengths, minimizing relative differences in length between current paths through the resistive elements 206. The FPR 202 and SPR 204 may be separated by an insulation sheet 214. The FPR 202, SPR 204, and insulation sheet 214 may be formed from an insulated metal substrate (IMS) board having a first conductive layer, second conductive layer, and insulation layer, respectively. The top, conductive layer 202 may be etched to expose the insulation layer 214. Solder joints 216 may connect the resistive elements 206 disposed on insulation layer 214 with the FPR 202 and SPR 204. A FPL 208 may connect to the FPR 202 through a protrusion extending from the FRP 202. A SPL 210 may connect to the SPR 204. A signal terminal 220 may house a FPL 208 and SPL 210. The SPL 210 may be the outer housing of an SMC connector. The housing may be electrically connected to the SPR 204 such that the potential of the SPR 204 and SPL 210 are the same. The FPL 208 may be electrically connected to the FPR 202 via a conductor 224 (e.g., wire).

Since all conductors intrinsically resist the flow of electrons based on the length of the conduction path, the length between the FPR 202 and SPR 204 from the terminal 218 can have an impact on the voltage drop. Meaning, dissimilar lengths of conductive material in the path may cause errors or uncertainty in the voltage drop measurement. The 90° corner may cause dissimilar lengths of the current path. The shunt 200, therefore, is designed such that the connecting edge of the FPR 202 and resistive elements 206 may be nonlinear ensuring that a plurality of current paths among the FPR 202 have similar lengths to reduce resistive variance of the current paths. The similar lengths may also reduce inductive variance of the current paths, as well. The substantially similar current path lengths may also reduce hot spots within the conduction path.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A shunt comprising:
   a power terminal having a planar first potential region (FPR) connected to a second potential region (SPR) through a resistive element, the SPR being offset from and parallel to the FPR; and
   a sensor terminal having a first potential lead (FPL) connected to the FPR, and a second potential lead (SPL) connected to the SPR and separated from the FPL by an insulation sheet, the SPL and sheet covering the resistive element.

2. The shunt of claim 1, wherein the resistive element is coplanar with the SPR.

3. The shunt of claim 2, wherein the FPR is insulated from the SPR by an insulation sheet.

4. The shunt of claim 3, wherein the resistive element connects to the FPR only through solder joints.

5. The shunt of claim 1, wherein the FPL has a pointed shape such that a plurality of current paths among the FPR and FPL have similar lengths to reduce resistive variance of the current paths of a sensor probe.

6. The shunt of claim 1, wherein the SPL has a pointed shape such that a plurality of current paths among the SPR and SPL have similar lengths to reduce resistive variance of the current paths of a sensor probe.

7. A shunt comprising:
   a power terminal having a substantially planar first potential region (FPR) connected to a second potential region (SPR), that is substantially parallel to the FPR, through a resistive element having a predetermined resistance; and a sensor terminal including a first potential lead (FPL) connected to the FPR at a plurality of solder joints, the FPL having a pointed shape defining current paths such that the current paths through the sensor terminal have similar lengths to reduce resistive variance among the current paths and include a second potential lead (SPL) connected to the SPR and separated from the FPL by an insulation sheet, the SPL and sheet covering the resistive element.

8. The shunt of claim 7, wherein the resistive element is coplanar with the SPR.

9. The shunt of claim 8, wherein the FPR is insulated from the SPR by an insulation sheet.

10. The shunt of claim 9, wherein the resistive element connects to the FPR and SPR only through solder joints.

11. The shunt of claim 7, wherein the plurality of solder joints has a nonlinear shape to further define the current paths.

12. The shunt of claim 7, wherein the plurality of solder joints has a rounded shape to further define current paths.

13. A shunt comprising:

a power terminal having a substantially planar first potential region (FPR) connected to a second potential region (SPR), that is substantially parallel to the FPR, through a resistive element having a predetermined resistance and having a nonlinear arrangement along a plane of the FPR such that current paths through the resistive element are same; and a sensor terminal having a first potential lead (FPL) connected to the FPR, and a second potential lead (SPL) connected to the SPR and separated from the FPL by an insulation layer.

14. The shunt of claim 13, wherein the FPR and SPR are different conductive layers of an insulated metal substrate board including a first conductive layer, a second conductive layer, and the insulation layer.

15. The shunt of claim 14, wherein the first conductive layer is electrically connected to the second conductive layer through the resistive element.

16. The shunt of claim 15, wherein the SPL is a housing of the sensor terminal.

17. The shunt of claim 15, wherein the nonlinear arrangement is a pointed shape.

18. The shunt of claim 17, wherein the FPL connects to the point of the shape.

19. The shunt of claim 15, wherein a portion of the insulation layer is removed to allow conduction between the first conductive layer and second conductive layer through the resistive element.

* * * * *